United States Patent [19]

Hirai et al.

[11] Patent Number: 4,588,964
[45] Date of Patent: May 13, 1986

[54] HERMETICALLY SEALED MICROWAVE SOLID-STATE OSCILLATOR WITH DIELECTRIC RESONATOR TUNED BY ELECTROMAGNETICALLY COUPLED TERMINATING ADMITTANCE

[75] Inventors: Kenji Hirai, Yokohama; Hideki Torizuka, Kawasaki, both of Japan

[73] Assignee: Kabushiki Kaisha Toshiba, Tokyo, Japan

[21] Appl. No.: 660,002

[22] Filed: Oct. 10, 1984

[30] Foreign Application Priority Data

Dec. 26, 1983 [JP] Japan .................... 58-244300

[51] Int. Cl.$^4$ .................... H03B 1/04; H03B 7/00
[52] U.S. Cl. .................... 331/67; 331/68; 331/96; 331/107 DP; 331/177 R
[58] Field of Search ............ 331/67, 68, 96, 107 DP, 331/117 D, 177 R; 333/250; 361/399

[56] References Cited

U.S. PATENT DOCUMENTS 4,321,560 3/1982 Nishikawa et al. ........ 331/117 D X
4,325,035 3/1982 Nishikawa et al. .............. 331/96

FOREIGN PATENT DOCUMENTS 0033450 3/1977 Japan .......................... 333/250
0083556 7/1978 Japan ....................... 331/107 SL

OTHER PUBLICATIONS

Mizumura et al., "Oscillators Stabilized with a Dielectric Resonator and Microwave Communication Systems:", *NEC Res & Develop.*, No. 70, Jul. 1983, pp. 112–119.
"Hermetically Sealed DROs are Mechanically Tunable", *Microwaves & RF*, Oct. 1983, p. 147.

*Primary Examiner*—Eugene R. LaRoche
*Assistant Examiner*—D. C. Mis
*Attorney, Agent, or Firm*—Finnegan, Henderson, Farabow, Garrett & Dunner

[57] ABSTRACT

A microwave solid-state oscillator includes a casing hermetically enclosing a microwave oscillation device and a dielectric resonator electromagnetically coupled with the microwave oscillation device, an output terminal leading out an oscillation output from said casing, and a microwave terminal electromagnetically coupled to the dielectric resonator, one end of which is connected to a microwave line having a terminating admittance at the outside of the casing.

11 Claims, 11 Drawing Figures

HERMETICALLY SEALED MICROWAVE SOLID-STATE OSCILLATOR WITH DIELECTRIC RESONATOR TUNED BY ELECTROMAGNETICALLY COUPLED TERMINATING ADMITTANCE

BACKGROUND OF THE INVENTION

1. Field of the Invention

The present invention relates to a microwave solid-state oscillator constructed to control an oscillation frequency by means of a dielectric resonator and particularly to a microwave solid-state oscillator having its own frequency and an output regulation device.

2. Description of the Prior Art

A high-Q dielectric resonator having an excellent temperature stability is commonly used as a microwave oscillator demanding high stability, such as a local oscillator for microwave radio equipment. Usually, the microwave solid-state oscillator is constructed with a semiconductor oscillation device, such as a Gunn diode or an FET, mounted on a microstrip line formed on an insulated substrate made of alumina, and the oscillation device is made to be electromagnetically coupled to a dielectric resonator.

In this instance, the semiconductor oscillation device is often used as a state of a flip-chip of semiconductor in order to miniaturize an oscillator and to eliminate stray reactance in the device. With this condition, the dielectric resonator or the whole construction of the oscillator must be hermetically sealed to protect the dielectric resonator from moisture.

In the oscillator having such a dielectric resonator, the oscillation frequency generated therein fluctuates due to lack of uniformity of characteristics of the materials of the dielectric resonator or the semiconductor device and, further, due to the relationship of the dielectric resonator to the microstrip line or a sealed casing wall. Accordingly, the predetermined oscillation frequency or output is not regularly obtained. Moreover, in a local oscillator directly connected to a mixing circuit, it is very hard to regulate a load impedance of the local oscillator at a certain value. Thus, re-regulation of the oscillation frequency has been required.

Consequently, the microwave oscillator having a dielectric resonator demands equipment to regulate the oscillation frequency even after the dielectric resonator or the whole construction of the oscillator is hermetically sealed.

Conventionally, the equipment having a construction shown in FIG. 1 is used as the regulation equipment for oscillation frequency.

Namely, as shown in FIG. 1, microstrip line 1A upon which is mounted a semiconductor device (not shown) is formed by a microwave integrated circuit (hereinafter referred as MIC), which is disposed on substrate 1 made of an alumina. An oscillator is constructed by mounting dielectric resonator 2 on supporting base 3 made of dielectric materials having a small dielectric constant and electromagnetically connecting the dielectric resonator to the MIC.

Oscillation output terminal 4 is hermetically attached to lower case 5 by means of solder. Upper case 6 provides screw box 6A to accept adjustment screw 7 and provides cylindrical projection 6B. Hermetical sealing between adjusting screw 7 and upper case 6 is obtained with the aid of O-ring 8 mounted inside cylindrical projection 6B. Further, O-ring 9 provides hermetical sealing between upper case 6 and lower case 5.

With this construction, turning of adjusting screw 7 varies the distance 1 between the top surface of the dielectric resonator and the tip of the adjusting screw 7. By this variance, oscillation frequency can be varied while retaining the oscillator under the hermetically sealed condition.

Another prior art construction is illustrated in FIG. 2. Namely, microstrip line 11A mounting a semiconductor device is formed by the MIC, which is disposed on a substrate 11 made of an alumina. An oscillator is constructed by mounting dielectric resonator 12 on supporting base 13 made of dielectric materials having a small dielectric constant and electromagnetically connecting the dielectric resonator to the MIC.

Oscillation output terminal 14 is hermetically attached to lower case 15 by means of a solder.

Supporting base 13 which is cylindrically formed is closed at the side toward dielectric resonator 12 and is directly mounted to lower case 15 through bore 11B formed in substrate 11 by means of an adhesive agent. Adjusting screw 17 is mounted inside supporting base 13 through screw box 15A. Upper case 16 is flat and the junction between the upper case and lower case 15 is hermetically sealed with the aid of O-ring 18.

With this construction, turning of adjusting screw 17 varies the distance 1 between the bottom surface of dielectric resonator 12 and the tip of adjusting screw 17. By this operation, oscillation frequency can be varied while retaining the oscillator under the hermetically sealed condition.

Since, as stated in the above-mentioned two prior art constructions, the conventional method for regulating an oscillation frequency is carried out by adjusting the gap between the tip of the adjusting screw and the dielectric resonator and requires among other things, a screw and an O-ring, these conventional devices require minute mechanical work, are large in size and are very expensive. Moreover, since hermetical sealing is retained by means of an O-ring or an adhesive agent, the degree of airtightness has been low (being about $10^{-5}$ to $10^{-6}$ atm cc/s) and moisture-proofing has been hard to obtain.

SUMMARY OF THE INVENTION

An object of the present invention is, therefore, to provide a microwave solid-state oscillator constructed to regulate an oscillator frequency and an output by means of the regulation mechanism keeping a hermetic seal between the inside and the outside of a casing enclosing the oscillator and a dielectric resonator electromagnetically coupled with the oscillator.

In order to achieve the above object of the present invention and in accordance with the purpose of the invention as embodied a microwave solid-state oscillator for receiving a microwave line having a terminating admittance and for producing an oscillation output, the oscillator comprising a microwave oscillation device, a dielectric resonator electromagnetically coupled with the microwave oscillation device, a casing comprised of a cap and a stem for hermetically enclosing the microwave oscillation device and the dielectric resonator, an output terminal for the oscillation output leading out from the casing, and a microwave terminal electromagnetically coupled to the dielectric resonator and having one end positioned out of the casing and connected to the microwave line having the terminating admittance.

BRIEF DESCRIPTION OF THE DRAWINGS

The accompanying drawings, which are incorporated in and constitute a part of this specification, illustrate preferred embodiments of the invention and, together with the description, serve to explain the principles of the invention.

Of the drawings.

DESCRIPTION OF THE PREFERRED EMBODIMENTS

Reference will now be made in detail to the preferred embodiments of the invention, examples of which are illustrated in the accompanying drawings.

With reference to the equivalent circuit of FIG. 3, a basic embodiment of the microwave solid-state oscillator according to the invention will be described as follows.

An oscillation circuit is constructed by electromagnetically coupling high-Q dielectric resonator 22 to oscillation device circuit 21 using a Gunn diode or an FET (not shown). Output line 24 is electromagnetically coupled to dielectric resonator 22, and the output is supplied through output line 24 to load 23. Microwave line 25 is also electromagnetically coupled to dielectric resonator 22 independently of output line 24.

Figure 1:
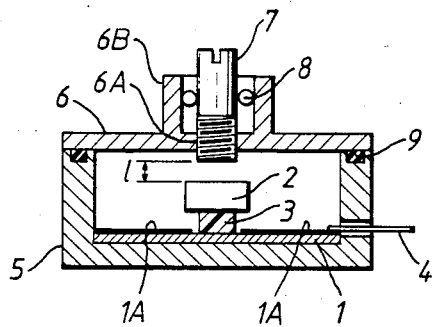
FIGS. 1 and 2 are sectional views showing different oscillation frequency regulating mechanisms in conventional microwave solid-state oscillators.
Figure 2:
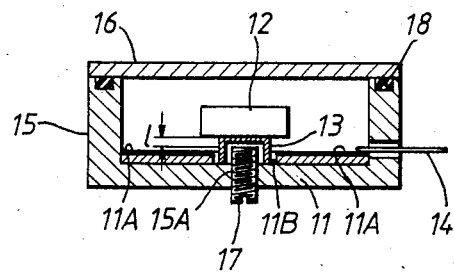
Figure 3:
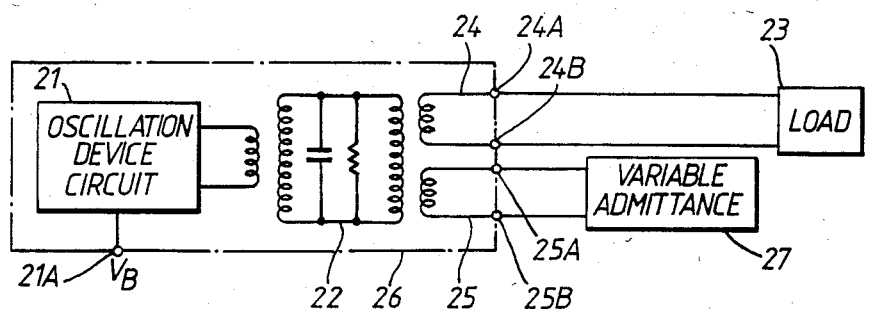
FIG. 3 is a diagrammatic equivalent circuit of the microwave solid-state oscillator of the invention.

Oscillation device circuit 21, high-Q dielectric resonator 22, output line 24 and microwave line 25 are housed in casing 26 shown by a dashed line in FIG. 3. Bias terminal 21A of the oscillating device circuit, output terminals 24A and 24B of output line 24 and microwave terminals 25A and 25B of microwave line 25 are each hermetically sealed terminals in casing 26. Microwave line 25 terminates at variable admittance 27 outside of casing 26.

With this circuit, variation of variable admittance 27 is equivalent to that of the admittance of dielectric resonator 22 which is connected to the variable admittance. Consequently, the output or frequency supplied to load 23 can be adjusted.

A change in variable admittance 27 is designated $\Delta Y = \Delta G + j\Delta B$, an external Q defined by the degree of magnetic coupling between output line 24 and dielectric resonator 22 is designated Qex1, an external Q defined by the degree of magnetic coupling between microwave line 25 and dielectric resonator 22 is designated Qex2. In this case, oscillation frequency fluctuation $\Delta f$, similarly with load pulling characteristics of an ordinary oscillator, has the relation of $\Delta f/f_0 \alpha \Delta B/Qex2$ (wherein $f_0$ denotes an operating frequency at the state of $\Delta B = 0$), and output fluctuation $\Delta P$ has the relation of $\Delta P/P_0 \alpha Qex1 \, x\Delta G/Qex2$ (wherein $P_0$ denotes an output at the state of $\Delta G = 0$). Accordingly, when the oscillation frequency is adjusted, $\Delta B$ shall be varied at the state of $\Delta G \approx 0$, and when the output is adjusted, $\Delta G$ shall be varied at the state of $\Delta B \approx 0$.

Figure 4:
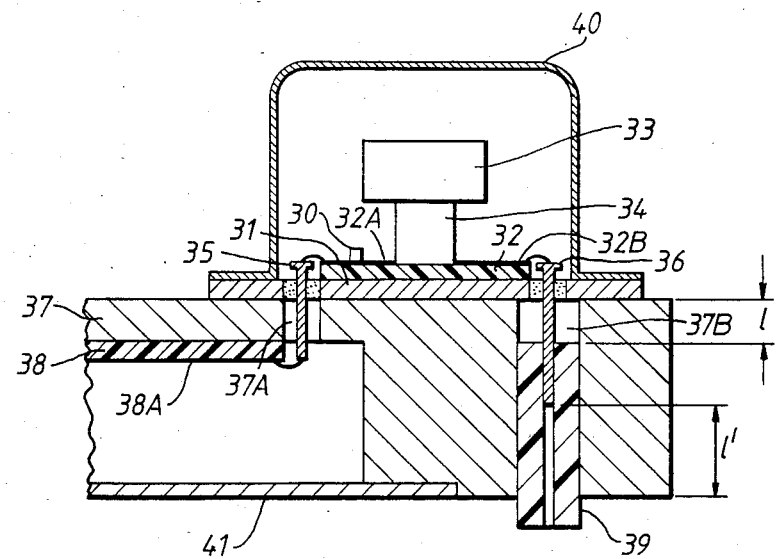
FIG. 4 is a sectional view of an embodiment of the microwave solid-state oscillator of the invention.

The first embodiment of the microwave solid-state oscillator of the invention is described as follows with reference to FIG. 4.

MIC substrate 32 (forming a microstrip line where microwave oscillation device 30 is mounted) is attached on stem 31 of the casing by some suitable means such as a solder. Dielectric reasonator 33 is mounted on supporting base 34 made of dielectric materials having small dielectric constant.

The supporting base is attached on MIC substrate 32 by some suitable means such as an adhesive agent. Since cap 40 of the casing is attached on a circumferential area of stem 31 in some appropriate manner such as by means of an electric welding, MIC substrate 32, dielectric resonator 33 and supporting base 34 are hermetically stored. At least three terminals pass through the stem, and each gap between a terminal and the stem is filled by insulating materials such as glass. In FIG. 4, only output terminal 35 and microwave terminal 36 are shown.

The top end of output terminal 35 is connected by gold-wiring or the like to output line 32A pattern (not particularly shown in FIG. 4) of the MIC substrate formed to electromagnetically couple the output terminal to dielectric resonator 33. The other end of the output terminal is connected to microstrip line 38A for supplying an oscillation output to a load through bore 37A formed in metal electric conductor 37. The microstrip line pattern is formed on MIC substrate 38 which is attached on metal electric conductor 37 by means of a solder or other suitable means. An MIC section including this MIC substrate is magnetically shielded by metal plate 41.

The top end of microwave terminal 36 is connected by gold-wiring or the like to microstrip line pattern 32B (not particularly shown in FIG. 4) formed to electromagnetically couple the microwave terminal to dielectric resonator 33. The other end of terminal 36 is projected halfway through bore 37B formed in metal electric conductor 37. A coaxial line is formed by using the metal electric conductor as an outer conductor. Cylindrical dielectric 39 is inserted in bore 37B so that the coaxial line distance 1 between the bottom end of stem 31 and the top end of cylindrical dielectric 39 can be selected by varying the length of insertion of the dielectric.

With this construction, the variable admittance can be regulated by arranging as desired the diameter of bore 37B, the materials of cylindrical dielectric 39 and coaxial line length 1. Thus, an oscillation frequency or an output can be regulated by adjusting the value of admittance.

As stated above, the present invention, the regulation mechanism for a frequency or an output can be provided outside of the hermetically sealed casing and so the casing has a simple structure. Furthermore, since means such as an electric welding can be used for hermetical sealing, a high degree of airtightness of below $10^{-7} \sim 10^{-8}$ atm cc/s necessary for a semiconductor chip can be easily obtained.

Moreover, since the regulation section is mechanically independent of an output circuit of the oscillator, the re-regulation can be easily accomplished after the oscillation circuit is connected to a load circuit. Additionally, external leakage of the oscillating output can be prevented by selecting the distance 1' between the bottom end of the terminal 36 and the bottom end of metal electric conductor 37 so as to cut-off the frequency in the band of an operating frequency.

Figure 5:
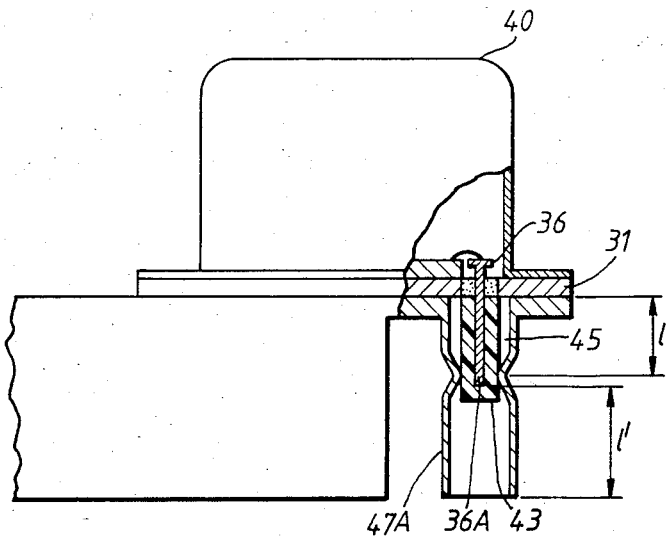
FIG. 5 is a partially broken away side view showing a second embodiment of the microwave solid-state oscillator of the invention.

Now, the second embodiment of the microwave solid-state oscillator will be explained with reference to FIG. 5. Like parts with those of the first embodiment are omitted, and like elements in FIG. 5 are shown by the same reference numerals as those of the first embodiment. Additionally, only the microwave line and a variable admittance are shown in section.

In FIG. 5, a portion of microwave terminal 36 projecting from stem 31 is insulated by insulator 43. Cylindrical conductor 47A is formed to have a coaxial line with terminal 36 and insulator 43. With this construction, after the oscillator is set to operate with the desired operating characteristics, cap 40 is fixed on the circumferential area of stem 31 so as to hermetically seal the casing.

When a frequency or an output fluctuates due to the connecting of a load circuit, such as a mixer, adjustment is carried out as follows.

Cylindrical conductor 47A is dented, as shown by a tool such as a pincer, in a position of the distance 1 from the bottom surface of stem 31 near tip portion 36A of terminal 36. By this dent, the capacitance near an opening end of the coaxial terminal line 45 increases and so the terminating admittance of the microwave line can be varied. Consequently, an oscillation frequency or an output can be regulated by denting cylindrical conductor 47A. The variation of the admittance can be set in accordance with the dented form of the cylindrical conductor and the distance 1. In the present instance, the microwave leakage to the environment can be prevented by selecting the distance 1' so as to cut-off the frequency in the band of an operating frequency. This construction is mechanically stable because tip portion 36A of terminal 36 is fixed by conductor 47A.

Next, the third embodiment of the present invention will be explained with reference to FIG. 6. However, as with FIG. 5, like parts of the first embodiment are either omitted from FIG. 6 or shown with like reference numerals as those of FIG. 4. Additionally, only the microwave line and a variable admittance are shown in section.

Figure 6:
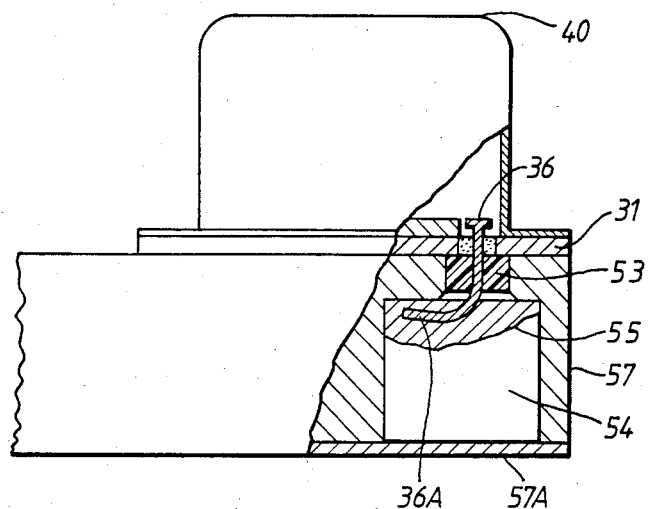
FIG. 6 is a partially broken away side view showing a third embodiment of the microwave solid-state oscillator of the invention.

In FIG. 6, insulator 53 surrounds a part of microwave terminal 36 that projects from stem 31. Tip portion 36A of terminal 36 projects into cavity portion 54. With this construction, after the operation of an oscillator is set to operate with the desired operating characteristics, cap 40 is fixed on the circumferential area of stem 31 so as to hermetically seal the casing.

The adjustment of frequency or output is carried out as follows. Tip portion 36A of terminal 36 is deformed to come close to metal conductor 57. By this deformation, the terminating admittance of the microwave line is varied and, consequently, an oscillation frequency or an output can be regulated. The variation of the admittance can be made in accordance with the deformation of the tip portion.

If necessary, the tip portion of terminal 36 can be physically fixed by filling a portion of cavity 54 with adhesive agent 55. After that, cavity 54 is electromagnetically shielded by lid plate 57A.

Next, the fourth embodiment of the microwave solid-state oscillator will be described with reference to FIGS. 7(a) and 7(b). Like parts with those of the first embodiment are omitted.

Figure 7A:
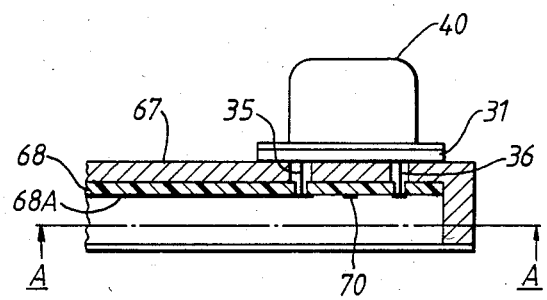
FIGS. 7(a) and 7(b) show the fourth embodiment of the microwave solid-state oscillator of the present invention, FIG. 7(a) being a partially broken away side view of the embodiment and FIG. 7(b) being a sectional view of the fourth embodiment taken along line A—A and in the arrow direction of FIG. 7(a).
Figure 7B:
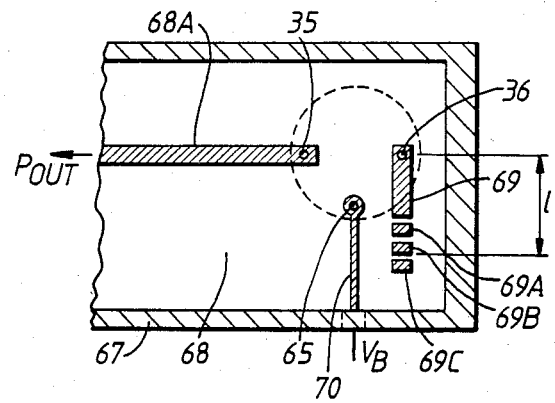

In FIGS. 7(a) and 7(b) output terminal 35, microwave terminal 36 and bias terminal 65 are inserted into bores provided in metal conductor 67 and MIC substrate 68 and are electronically connected to microstrip lines 68A, 69 and 70, respectively, by soldering, gold-wire bonding or the like. Microstrip line 69 has conductive islands 69A, 69B and 69C for selection of the electric length of an opening end of the oscillator, and distance 1 can be selected by connecting the islands to one another as desired by means of soldering or gold-wire bonding or the like. Thus, a terminating admittance of the microwave line can be variably set and, as a result, an oscillation frequency or an output can be regulated.

Figure 8A:
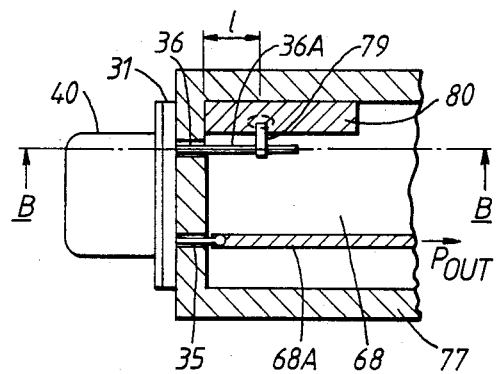
FIGS. 8(a) and 8(b) show a fifth embodiment of the microwave solid-state oscillator of the invention, FIG. 8(a) being a partially broken away side view and FIG. 8(b) being a sectional view of the fifth embodiment taken along line B—B and in the arrow direction of FIG. 8(a).
Figure 8B:
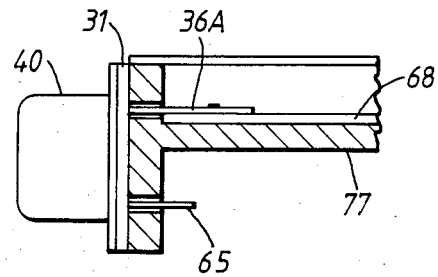

With reference to FIGS. 8(a) and 8(b), a fifth embodiment of the microwave solid-state oscillator will now be described. In these drawings, the same numerals as those used in the fourth embodiment are added to like parts therewith, and the like parts are not particularly described.

Tip portion 36A of microwave terminal 36 projects parallel to the surface of MIC substrate 68 where a microstrip line pattern is formed. The tip portion of terminal 36 and grounded pattern 80 are electrically connected to each other in a location at distance 1 from the end of MIC substrate 68 by means of a short-circuit conductor 79 attached by soldering, thermal compression bonding or the like. The terminating admittance of the microwave line can be variably set by suitably selecting the distance 1.

This embodiment also has bias terminal 65 for an oscillation device that is attached on the rear surface of the MIC substrate of the output line. The numeral 77 shows a metal conductor.

Figure 9:
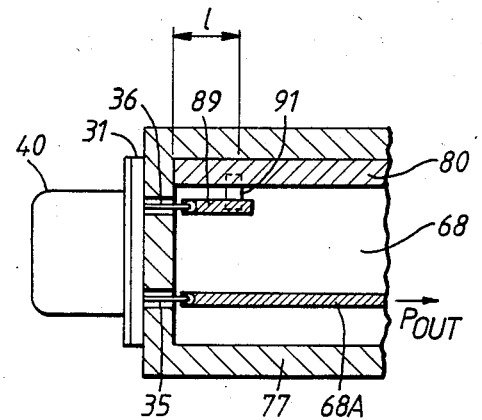
FIG. 9 is a partially broken away side view showing a sixth embodiment of the invention.

With reference to FIG. 9, a sixth embodiment of the microwave solid-state oscillator will be described. The same numerals as shown in FIG. 4 are used on like parts in FIG. 9, which are not particularly explained.

Chip resistor 91 is connected between microstrip line 89 and grounded pattern 80 at the location distance 1 from the end of MIC substrate 68 by soldering or other suitable means. Since a terminating admittance of the microwave line can be variably set by selecting the distance 1 and the resistance value of chip resistance, an oscillation frequency or an output can be regulated similarly to that of the last embodiment discussed.

Similarly, a terminating admittance can be also variably set by selecting the distance 1 in FIG. 9 and the capacitance of a chip capacitor (not shown) used in place of chip resistor 91. In this case, by selecting a temperature coefficient of the chip capacitor, the temperature compensation effect for the oscillator characteristics can be created.

In the embodiments described above, each has a construction such that the output terminal and the microwave line are formed perpendicular to the MIC substrate forming the oscillating circuit in the casing. However, it goes without saying that each terminal can be formed parallel to the MIC substrate as done in conventional terminal disposition.

What is claimed is:

1. A microwave solid-state oscillator for producing an oscillation output, said oscillator comprising:
   a microwave oscillation device circuit;
   a dielectric resonator electromagnetically coupled with said microwave oscillation device circuit;
   a casing comprised of a cap and a stem for hermetically enclosing said microwave oscillation device circuit and said dielectric resonator;
   an output terminal for said oscillation output leading out from said casing, said terminal having an end positioned within said casing, said end being electromagnetically coupled to said dielectric resonator; and
   a microwave line comprised of an inner portion positioned within said casing, said inner portion being electromagnetically coupled to said dielectric resonator and an outer portion positioned out of said casing said outer portion including an adjustable terminating admittance means for adjusting said output of said oscillator.

2. The microwave solid-state oscillator of claim 1 wherein said outer portion of said microwave line comprises a microwave terminal projecting into a cavity portion and being fixed with an adhesive agent which fills a portion of said cavity.

3. The microwave solid-state oscillator of claim 2 wherein an end of said microwave terminal is deformed.

4. The microwave solid-state oscillator of claim 1 wherein said outer portion of said microwave line comprises a microwave terminal and a cylindrical conductor formed as an outer conductor.

5. The microwave solid-state oscillator of claim 4 wherein said cylindrical conductor is dented around said microwave terminal.

6. The microwave solid-state oscillator of claim 1 wherein said outer portion of said microwave line comprises a microstrip line.

7. The microwave solid-state oscillator of claim 6 wherein said microstrip line has a plurality of conductive islands selectively connectable to each other.

8. The microwave solid-state oscillator of claim 6 further comprising a short-circuit conductor, and wherein said outer portion of said microwave line comprises a microwave terminal connected to a grounded pattern through said short-circuit conductor.

9. The microwave solid-state oscillator of claim 1 wherein said outer portion of said microwave line comprises a metal electric conductor and a microwave terminal projecting into a bore formed in said metal electric conductor.

10. The microwave solid-state oscillator of claim 9 further having a cylindrical dielectric material being inserted in said bore.

11. The microwave solid-state oscillator of claim 1 further comprising a grounded pattern and a chip resistor wherein said outer portion of said microwave line comprises a microstrip line connected to said grounded pattern through said chip resistor.

* * * * *